United States Patent
Le Gal et al.

(10) Patent No.: US 11,493,575 B2
(45) Date of Patent: Nov. 8, 2022

(54) THREE-AXIS OPTICALLY PUMPED MAGNETOMETER FOR GRADIOMETRIC MEASUREMENT

(71) Applicant: COMMISSARIAT A L'ENERGIE ATOMIQUE ET AUX ENERGIES ALTERNATIVES, Paris (FR)

(72) Inventors: Gwenael Le Gal, Grenoble (FR); Agustin Palacios Laloy, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 17/335,296

(22) Filed: Jun. 1, 2021

(65) Prior Publication Data
US 2021/0373096 A1    Dec. 2, 2021

(30) Foreign Application Priority Data
Jun. 2, 2020 (FR) .................................. 20 05774

(51) Int. Cl.
*G01R 33/26* (2006.01)
(52) U.S. Cl.
CPC .................................. *G01R 33/26* (2013.01)
(58) Field of Classification Search
CPC .............................. G01R 33/022; G01R 33/26
See application file for complete search history.

(56) References Cited

U.S. PATENT DOCUMENTS

| 8,212,556 | B1 | 7/2012 | Schwindt et al. |
| 10,845,438 | B2 | 11/2020 | Palacios Laloy |

(Continued)

FOREIGN PATENT DOCUMENTS

| EP | 3 364 204 A1 | 8/2018 |
| EP | 3 524 990 A1 | 8/2019 |

OTHER PUBLICATIONS

French Preliminary Search Report dated Feb. 26, 2021 in French Application 20 05774 filed on June 2, 2020, 2 pages (with English Translation of Categories of Cited Documents)

(Continued)

*Primary Examiner* — Jay Patidar
(74) *Attorney, Agent, or Firm* — Oblon, McClelland, Maier & Neustadt, L.L.P.

(57) ABSTRACT

A three-axis vector optically pumped magnetometer includes a cell filled with an atomic gas subjected to an ambient magnetic field the projection of which on three rectangular coordinate axes defines three components thereof, and a photodetector arranged to receive a probe beam that passed through the cell. The photodetector includes a plurality of measurement units arranged in a plane transverse to a direction of propagation of the probe beam, the measurement units each providing a photodetection signal. The magnetometer further comprises a processing unit configured to determine, for each measurement unit and from the photodetection signal, a measurement associated with the measurement unit of each of the three components of the ambient magnetic field; calculate at least one difference between the measurements, associated with different measurement units, of a component of the magnetic field; and deliver a gradiometric measurement signal including the at least one difference calculated.

9 Claims, 1 Drawing Sheet

(56) References Cited

U.S. PATENT DOCUMENTS

| | | | |
|---|---|---|---|
| 2004/0140799 A1 | 7/2004 | Romalis et al. | |
| 2013/0127458 A1 | 5/2013 | Mizutani et al. | |
| 2018/0210039 A1* | 7/2018 | Shalev | G01R 33/032 |
| 2019/0250223 A1 | 8/2019 | Palacios Laloy | |
| 2019/0391215 A1 | 12/2019 | Osaka | |

OTHER PUBLICATIONS

Colombo et al., "Four-channel optically pumped atomic magnetometer for magnetoencephalography", Optics Express, vol. 24, No. 14, 2016, 14 pages.

Kominis et al., "A subfemtotesla multichannel atomic magnetometer", Nature, vol. 422, 2003, 4 pages.

Qiu et al., "Three-axis atomic magnetometer for nuclear magnetic resonance gyroscopes", Applied Physics Letters 116, 034001, 2020, 6 pages.

Seltzer et al., "Unshielded three-axis vector operation of a spin-exchange-relaxation-free atomic magnetometer", Applied Physics Letters, vol. 85, No. 20, 2004, 3 pages.

Zhang et al., "Magnetoencephalography using a compact multi-channel atomic magnetometer with pump-probe configuration", AIP Advances 8, 125028, 2018, 7 pages U.S. Appl. No. 16/511,298, filed Jul. 15, 2019, 2020/0018802 A1, Palacios Laloy, A, et al.

U.S. Appl. No. 16/675,828, filed Nov. 6, 2019, 2020/0150196 A1, Beato, F, et al.

U.S. Appl. No. 16/723,096, filed Dec. 20, 2019, 2020/0200839 A1, Palacios Laloy, A, et al.

U.S. Appl. No. 16/801,282, filed Feb. 26, 2020, 2020/0278404 A1, Lieb, G, et al.

U.S. Appl. No. 16/812,664, filed Mar. 9, 2020, 2020/0292639 A1, Le Prado, M, et al.

U.S. Appl. No. 16/939,444, filed Jul. 27, 2020, 2021/0033686 A1, Garces Malonda, R, et al.

U.S. Appl. No. 17/307,329, filed May 4, 2021, Palacios Laloy, A.

\* cited by examiner

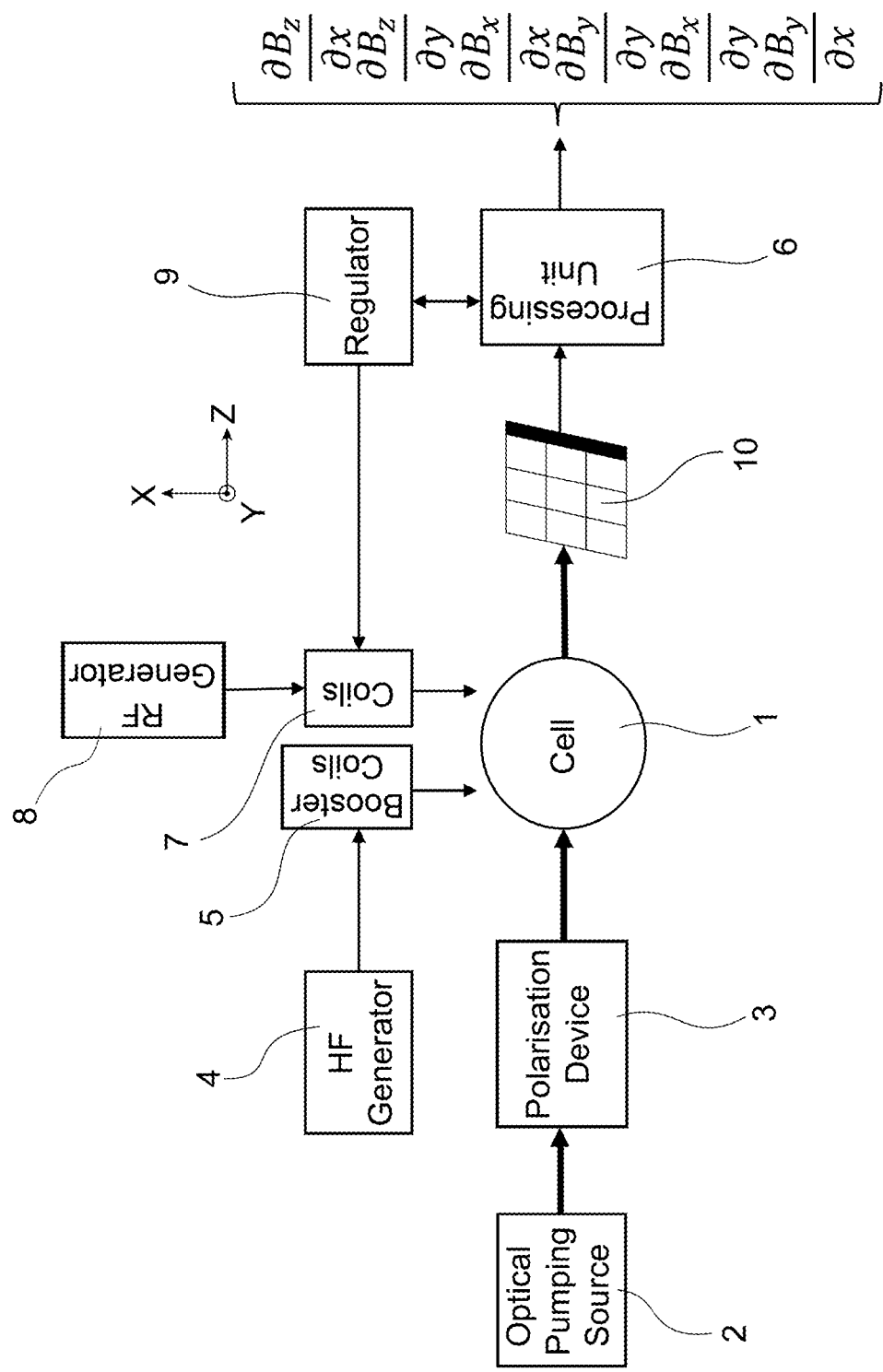

THREE-AXIS OPTICALLY PUMPED MAGNETOMETER FOR GRADIOMETRIC MEASUREMENT

TECHNICAL FIELD

The field of the invention is that of magnetic gradiometry, namely the measurement of a spatial gradient of a magnetic field. The invention relates in particular to the performance of a gradiometric measurement by means of an optically pumped magnetometer.

PRIOR ART

A measurement of the magnetic field gradient is usually carried out by subtracting the signals of several spatially distributed magnetometers. Such a measurement allows the rejection of common mode noise between the different measurement points and thus improvement of the sensitivity level of the magnetometric measurement. Gradiometry thus provides complementary information to magnetometry, especially as the spatial dependence of the measurements is different, which makes it possible to locate the sources of the magnetic field.

A gradiometric measurement can also be carried out by means of SQUID sensors, which have the capacity to intrinsically perform the magnetic field difference between two measurement zones. Indeed SQUID sensors measure the magnetic flux passing through a metal turn that includes superconducting junctions. By arranging two turns connected to each other so that the fluxes passing through each of them induce currents in opposite directions, the resulting current measured is directly proportional to the difference in magnetic fluxes through the turns.

SQUID sensors, on the other hand, allow only one component of the magnetic field, that orthogonal to the plane of the coil, to be measured. Two types of gradiometers can thus be made with SQUID sensors:

- longitudinal gradiometers where the two turns are in two parallel planes and separated by a distance b called the gradiometer base. Such a configuration allows the measurement of the magnetic field gradient in the direction longitudinal to the magnetic field ($\partial B_z/\partial z$);
- transverse gradiometers where the two turns are in the same plane and separated by a base b, the distance between the two centres of each turn. This configuration allows the gradient of a component of the magnetic field to be measured with respect to one of the directions transverse to the component ($\partial B_z/\partial x$ ou $\partial B_z/\partial y$).

One drawback of these gradiometers is that once the sensor is made, the base b as well as the direction of measurement of the gradient (transverse or longitudinal) are set. Furthermore, SQUID sensors require cryogenic cooling to operate and are usually placed inside magnetically shielded enclosures to dispense with external magnetic fields that could interfere with measurements. The size of these enclosures has to be large enough to contain the cryogenic vessel, which results in strong constraints on the cost and architecture of the buildings containing these devices, which constraints hinder their spreading.

An alternative to the SQUID sensor is the optically pumped magnetometer which uses an atomic gas confined in a cell, typically metastable helium or alkali gases, as the sensitive element. Such a magnetometer, which can take different configurations, allows the magnetic field to be deduced by exploiting the following three processes which take place either sequentially or concomitantly:

1) The use of polarised light sources, typically lasers, allows the preparation of atomic states characterised by some orientation or alignment of their spins. This process is called "optical pumping" in this field.

2) These atomic states change under the effect of the magnetic field, especially under the Zeeman effect, which corresponds to shifts in the energy levels as a function of the magnetic field to which the atoms are subjected.

3) The optical properties of the atomic medium then undergo modifications that depend on the state of the atoms. An optical measurement, for example an optical absorption measurement, can be used to deduce the Zeeman shift undergone and to derive a measurement of the magnetic field in which the cell is immersed.

There are two main categories of optically pumped magnetometers depending on the type of pumping made.

In the most common category, pumping is carried out with a pumping beam emitting circularly polarised light and the atomic gas acquires a so-called oriented state characterised by a non-zero average value of its magnetic moment along an axis, which happens to be that of the pumping beam propagation.

In the other category, pumping is carried out with a pumping beam emitting linear polarisation light and the atomic gas acquires a so-called aligned state characterised by a zero value of its magnetic moment, but by a non-zero value of a quantity of the type ($3 F_z^2 - F^2$) where F is the total angular momentum and $F_z$ the angular momentum along the direction of polarisation of the pumping beam.

The characterisation of the atomic states (step 3 above) can be carried out according to at least two ways:

- by measuring the absorption of a beam tuned (or very close) to the atomic transition under consideration (the beam used for pumping or a so-called "probe" beam with the same polarisation as the beam used for pumping);
- by using a so-called "probe" beam with linear polarisation and shifted in wavelength with respect to the atomic transition under consideration. Depending on the type of atomic polarisation (orientation or alignment), this beam undergoes a modification of its polarisation (rotation of the polarisation plane in the case of orientation, creation of a circularly polarised component in the case of alignment) which can be measured by separating two of the polarisation states of the beam (the two 45° polarisations in the case of orientation, the two circular polarisations in the case of alignment) and then photodetecting them in such a way as to identify the increase in one of the polarisations relative to the other. This is referred to as polarimetric measurement.

There are two physical effects that allow a vector measurement of the magnetic field. These are the Hanle effect and parametric resonances.

The first effect is mainly used in orientation magnetometers and has different alternatives to be probed, mainly in polarimetry, through a Faraday rotation measurement or a modulation of the probe beam polarisation. Its main advantage is that it allows an all-optical measurement of one or two components of the magnetic field, without requiring the application of radio frequency (RF) magnetic field(s). However, Hanle orientation configurations suffer from a lack of compactness, requiring several laser beams (pump and probe) propagating orthogonally to each other.

Parametric resonances are used in orientation and alignment magnetometers, mainly in absorption. The difference with the Hanle effect lies in the application of radio frequency magnetic fields to the cell containing the sensitive element, which allow linear dependencies of some frequency components of the photodetection signal on the components of the magnetic field to be shown. The advantage of this type of architecture is that a measurement of one or more components of the magnetic field can be made using a single laser beam acting as a pump and probe, thus enabling more compact magnetometers to be made. The use of this effect is often preferred for medical applications such as magnetoencephalography or magnetocardiography, which require a high density of sensors in the zone under study.

Gradiometry work with optically pumped magnetometers using a spatially resolved photodetector has been carried out by the team of M. V. Romalis at Princeton University (Kominis et al., *Nature Vol* 422, 2003). The architecture used relies on the Hanle effect to measure a single component of the magnetic field (the one perpendicular to the direction of propagation of the pump beam and the probe beam). Atoms, pumped in orientation, are probed by modulated Faraday rotation. The signal is collected on a segmented photodiode in the direction longitudinal to the measured component of the magnetic field. In this way it is possible to measure the longitudinal gradient of the component of the magnetic field ($\partial B_y/\partial y$).

Further work made subsequently by the same team makes use of an array of 16*16 photodiodes to measure the longitudinal gradient of the component of the magnetic field ($\partial B_y/\partial y$) as well as a gradient transverse to this component ($\partial B_y/\partial z$) while having a reconfigurable base.

More recently, a similar architecture to those aforementioned has been adapted to a magnetoencephalography measurement (Zhang et al., AIP Advances 8, 125028, 2018). The only difference is that the signal is analysed on the two linear polarisation bases instead of using a modulation of the probe beam polarisation to obtain the measurement signal. An array of 2*2 photodiodes is used, not allowing a reconfigurable base.

Other work using a spatially resolved photodetector has been made by P. Schwindt's team in Albuquerque (Colombo et al., Optics Express Vol 24, No 14, 2016). The architecture set forth in this publication is based on the principle of parametric resonances, allowing propagation of the pump and probe beams along the same direction and measurement of one of the two components of the magnetic field transverse to the direction of propagation of the laser beams in this case. The pump and probe beams are split into 8 different beams (4 pump beams and 4 probe beams) by diffraction, each copropagating pump/probe pair being sent to the 4 corners of a square cell containing the sensitive element. An array of 2*2 photodiodes is used to collect information on the 4 probe beams. This architecture allows the measurement of the longitudinal gradient of the component of the magnetic field ($\partial B_y/\partial y$) as well as a transverse gradient to the same component ($\partial B_y/\partial x$) with a fixed base in both directions.

All of the aforementioned work has been carried out by measuring a single component of the magnetic field. These architectures can easily be extended to a measurement of a second component of the magnetic field, the one perpendicular to the direction of propagation of the pump beam. In the case of Hanle configurations, this requires the addition of a second probe beam propagating perpendicular to the pump beam and the first probe beam. In the case of the parametric resonance architecture, this requires the addition of a second radio frequency magnetic field orthogonal to the direction of propagation of the probe beam and the direction of the first radio frequency field. It is not possible to obtain the third and final component of the magnetic field in orientation-pumped Hanle configurations. In the case of orientation-pumped parametric resonances, it is possible to obtain it by a second-order effect but with a much lower sensitivity than in the other two axes.

From the gradient measurement point of view, these architectures allow at best to measure only four components of the gradient tensor (measurement of two components of the magnetic field in two directions) out of the nine it includes.

DISCLOSURE OF THE INVENTION

One purpose of the invention is to provide an optically pumped magnetometer capable of measuring all the components of the magnetic field tensor. To this end, the invention relates to a three-axis vector optically pumped magnetometer, comprising:
  a cell filled with an atomic gas subjected to an ambient magnetic field, the projection of which on three rectangular coordinate axes defines three components thereof,
  a photodetector arranged to receive a probe beam that passed through the cell, and
  a processing unit coupled to the photodetector.

The photodetector comprises a plurality of measurement units arranged in a plane transverse to a direction of propagation of the probe beam, the measurement units each providing a photodetection signal.

The processing unit is configured to:
  determine, for each measurement unit and from the photodetection signal provided by the measurement unit, a measurement, associated with the measurement unit, of each of the three components of the ambient magnetic field; and
  calculate at least one difference between the measurements, associated with different measurement units, of a component of the magnetic field and deliver a gradiometric measurement signal comprising the at least one difference calculated.

Some preferred but non-limiting aspects of the magnetometer are as follows:
  the measurement units of the photodetector are arranged in array form and are at least 3*3 in number;
  the photodetector is an array of photodiodes;
  the photodetector is a charge coupled detector;
  a measurement unit of the photodetector is formed by a plurality of pixels close to the charge coupled detector, the photodetection signal of a measurement unit corresponding to the average of the photodetection signals individually delivered by the pixels of the measurement unit;
  it further comprises:
  a parametric resonance excitation circuit configured so that it induces in the cell a radio frequency magnetic field having two components each oscillating at its own oscillation frequency,
  an optical pumping source arranged to emit towards the cell a pump beam tuned to an atomic transition, the probe beam being identical to or distinct from the pump beam,
  a polarisation device configured to impart a linear polarisation to the pump beam,
  and, to determine a measurement, associated with a measurement unit, of each of the three components of the ambient magnetic field, the processing unit is configured to perform synchronous detection of the photodetection signal provided by the measurement unit at a harmonic of each of the oscillation frequencies and at an inter-harmonic of said oscillation frequencies:

it further comprises:
a parametric resonance excitation circuit configured so that it induces in the cell a radio frequency magnetic field having three components each oscillating at its own oscillation frequency,
an optical pumping source arranged to emit towards the cell a pump beam tuned to an atomic transition, the probe beam being identical to or distinct from the pump beam,
a polarisation device configured to impart an elliptical polarisation to the pump beam,
and, to determine a measurement, associated with a measurement unit, of each of the three components of the ambient magnetic field, the processing unit is configured to perform synchronous detection of the photodetection signal provided by the measurement unit at a harmonic of each of the oscillation frequencies.

The three components of the ambient magnetic field comprise two components, $B_x$ and $B_y$, transverse to the direction of propagation of the probe beam and one component, $B_z$, longitudinal to the direction of propagation of the probe beam and the gradiometric measurement signal comprises:
the transverse gradients of the $B_z$ component, $\partial B_z/\partial x$ and $\partial B_z/\partial y$,
the longitudinal gradients of the $B_x$ and $B_y$ components, $\partial B_x/\partial x$ and $\partial B_y/\partial y$,
a transverse gradient of the $B_x$ component and a transverse gradient of the $B_y$ component, $\partial B_x/\partial y$ et $\partial B_y/\partial x$.

BRIEF DESCRIPTION OF THE DRAWINGS

Further aspects, purposes, advantages and characteristics of the invention will become clearer from the following detailed description of preferred embodiments thereof, given by way of non-limiting example, and made with reference to the appended drawings in which:

FIG. 1 is a diagram of a magnetometer in accordance with the invention.

DETAILED DISCLOSURE OF PARTICULAR EMBODIMENTS

With reference to FIG. 1, the invention relates to an optically pumped magnetometer which comprises a cell 1 filled with an atomic gas, for example helium-4 or an alkaline gas, subjected to an ambient magnetic field $B_0$, the projection of which on three rectangular coordinate axes defines three components thereof. The ambient magnetic field can thus be resolved into three components $B_x$, $B_y$ and $B_z$, each along one of the magnetometer's measurement axes x, y and z.

The magnetometer according to the invention is a three-axis vector magnetometer, i.e. capable of measuring each of the three components $B_x$, $B_y$ and $B_z$ of the ambient magnetic field. As will be described below, the magnetometer according to the invention is also capable of measuring a spatial gradient of the derivative of the ambient magnetic field.

The cell 1 is lighted by an optical pumping source 2 capable of emitting towards the cell 1 a light beam, for example a laser beam, tuned to a pumping wavelength (this beam is thus also referred to as a pump beam). The pumping wavelength is tuned to an atomic transition line, for example to the $D_0$ line at 1083 nm in the case of helium-4. The light beam is polarised by means of a polarisation device 3 inserted between the optical pumping source and the cell or directly integrated into the optical pumping source.

In the case where the sensitive element is helium-4, the magnetometer further includes a high frequency (HF) discharge system, comprising a HF generator 4 and booster coils 5, to bring the atoms of the atomic gas into an energised state where they are able to undergo the atomic transition when lighted by the pump beam, typically in the $2^3S_1$ metastable state.

The light beam used for pumping (i.e. preparation of the atomic states necessary for a measurement of the magnetic field by optical pumping) can also be used as a probe beam for the detection of the pumping-induced atomic states, indeed its absorption by the atoms carrying information on the value of the components of the static magnetic field to which the sensitive element is subjected. FIG. 1 illustrates such an exemplary embodiment with a propagation of the (pump and probe) beam oriented along the direction $\vec{z}$.

Alternatively, it is possible to use a probe beam separate from the pump beam. In such a case, it is useful to shift the frequency of the probe light relative to the frequency of the atomic transition used so as not to induce residual pumping with the probe beam. This shift means that an absorption measurement is of low efficiency and that it is therefore preferable to carry out a birefringence measurement, known as a polarimetric measurement.

In general, no known optically pumped magnetometer design allows measurement of the derivative of the component of the magnetic field oriented along the direction of propagation of the probe beam. In the architectures set forth in the introduction which are based on orientation optical pumping, the longitudinal component of the magnetic field ($B_z$, i.e. that parallel to the direction of propagation of the pump beam) cannot be measured. Therefore none of the $B_z$ gradients can be measured. Furthermore, the gradients along the direction of propagation of the probe beam cannot be measured either.

The invention disclosed here consists in measuring the three components of the ambient magnetic field and their variations along the two axes transverse to the propagation of the probe light. For this, the invention suggests to provide a three-axis magnetometer with a photodetector that includes a plurality of measurement units arranged in a plane transverse to the direction of propagation of the probe beam, for example a 2D array of photodiodes or a charge coupled device (CCD) type imager. This magnetometer can thus measure the three components of the magnetic field, determine their spatial dependence on the two directions transverse to the direction of propagation of the probe beam, and derive the entirety of the components of the magnetic field tensor for reasons set out below.

The three-axis vector magnetometer allows the three components of the magnetic field to be measured concomitantly, namely the $B_x$ and $B_y$ components, both transverse to the direction of propagation of the probe beam, and the $B_z$ component, longitudinal to the direction of propagation of the probe beam. The use of the photodetector makes it possible to obtain the spatial distribution of these three components of the magnetic field along the two directions orthogonal to the direction of propagation of the probe beam by measuring the signal collected independently on each measurement unit of the photodetector. This makes it possible to obtain six components of the magnetic field gradient tensor by differential measurement:

$\partial B_z/\partial x$ and $\partial B_z/\partial y$, transverse gradients of the $B_z$ component of the magnetic field, $\partial B_x/\partial x$ and $\partial B_y/\partial y$, longitudinal gradients of the $B_x$ and $B_y$ components of the magnetic field, $\partial B_x/\partial y$ and $\partial B_y/\partial x$, a transverse gradient of the $B_x$ component and a transverse gradient of the $B_y$ component.

Since the magnetisation of the sensitive element used for the measurement is very low, the volume over which the magnetic field measurement is performed (the cell including the sensitive element) does not contain significant magnetic field sources (ferromagnetic materials or electric currents). Therefore, Maxwell equations governing the behaviour of the magnetic field in this medium are expressed as follows:

$$\vec{\mathrm{rot}}\vec{B}=0 \quad (1)$$

$$\mathrm{div}\vec{B}=0 \quad (2)$$

These two equations lead to dependencies between some components of the magnetic field gradient tensor.

Equation (1) leads to:

$$\frac{\partial B_y}{\partial z} = \frac{\partial B_z}{\partial y} \quad (3)$$

$$\frac{\partial B_x}{\partial z} = \frac{\partial B_z}{\partial x} \quad (4)$$

$$\frac{\partial B_y}{\partial x} = \frac{\partial B_x}{\partial y} \quad (5)$$

Equation (2) leads to:

$$\frac{\partial B_z}{\partial z} = -\left(\frac{\partial B_x}{\partial x} + \frac{\partial B_y}{\partial y}\right) \quad (6)$$

Equations (3), (4), (5) and (6) show that only five components of the magnetic field gradient tensor are independent. Thus, the measurement of five components allows the complete characterization of this tensor. The magnetometer according to the invention makes it possible to measure six components of the gradient tensor and thus to be able to deduce the last three which it is not possible to measure physically by virtue of the properties derived from Maxwell equations (equations (3), (4) and (6)).

Returning to FIG. 1, the laser beam (which in this example serves both as pump and probe) can be conveyed by an optical fibre at the end of which it diverges at an angle depending on the numerical aperture of the fibre used. This diverging beam is collimated before passing through the cell, for example by using a converging lens. At the outlet of this assembly allowing collimation, the beam passes through the polarisation device 3 giving a specific polarisation to the light before it passes through the cell, for example linear or elliptical polarisation as will be described later.

After passing through the cell, the laser beam passes through a so-called projection lens which allows the expansion (diverging lens) or focusing (converging lens) the collimated beam over an area similar to that of the sensitive surface area of the photodetector used.

As seen previously, the photodetector 10 comprises a plurality of measurement units arranged in a plane transverse to the direction of propagation of the probe beam. Each of the measurement units provides a photodetection signal to a processing unit 6 coupled to the photodetector 10.

The processing unit 6 is configured to determine, for each measurement unit and from the photodetection signal provided by the measurement unit, a measurement, associated with the measurement unit, of each of the three components of the ambient magnetic field. The processing unit is further configured to calculate at least one difference between the measurements, associated with different measurement units, of a component of the magnetic field and to deliver a gradiometric measurement signal comprising the at least one difference calculated. The processing unit is preferably configured to calculate the six above-mentioned gradients.

The magnetometer can also comprise a closed loop feedback control system of the magnetometer for constantly subjecting the sensitive element to a total magnetic field of zero. The feedback control system comprises a regulator 9 coupled to the processing unit 6 and which injects current into Helmholtz coils 7 of orthogonal axes surrounding the cell 1 in order to generate a compensating magnetic field Bc such that the sum Bc+B₀ is maintained at zero at all times.

Alternatively, the magnetometer can be operated in an open loop, without compensation for the ambient field.

The measurement units of the photodetector 10 are typically arranged in array form and are preferably at least 3*3 in number. The measurement of the different gradients is obtained by making the difference between the measurements of the components of the magnetic field resulting from photodetection of the different measurement units. This difference can be made between the measurements from all the measurement units, thus allowing with at least 3*3 measurement units to provide a reconfigurable base in length and direction for the gradiometric measurement of the three components of the magnetic field.

The photodetector 10 can be a photodiode array. Alternatively, the photodetector 10 can be a charge coupled detector CCD. In this alternative, a measurement unit of the photodetector 10 can be formed by a plurality of pixels close to the CCD detector, the photodetection signal of a measurement unit corresponding to the average of the photodetection signals individually delivered from the pixels of the measurement unit. The number of close pixels can depend on the resolution of the CCD detector and the characteristics of the cell containing the sensitive element, especially the pressure of the gas contained therein. It is not helpful if the surface area of the artificial pixel (pool of close pixels) is smaller than the projection of the diffusion volume of the atoms onto the plane of the detector, which is the limit of spatial resolution achievable using an atomic vapour as the sensitive element. In the case of helium-4 metastable at room temperature and a pressure of 10 Torr, this surface area is about 4 mm².

Sensitivities of each measurement unit can be different depending on their position on the photodetector, due to the inhomogeneous distribution of the light intensity within the laser beam in the plane perpendicular to the propagation of the probe beam (the light intensity distribution is usually Gaussian in this plane). So, in one possible embodiment, a correction for these differences in sensitivity is implemented by the processing unit 6.

In a preferential embodiment, the magnetometer according to the invention is a parametric resonance magnetometer. It thus comprises a parametric resonance excitation circuit which includes a radio frequency generator 8 which feeds the Helmholtz coils 7 having orthogonal axes surrounding the cell 1 in order to generate a magnetic field for exciting the parametric resonances, also referred to as the radio frequency field. The cell 1 and coils 7 assembly is placed within a passive magnetic shield made of μ-metal in order to isolate it from the ambient magnetic fields (Earth's field and electromagnetic disturbances), which are too intense to respect the physical condition $\gamma B \ll \Gamma$ necessary for the appearance of parametric resonances.

In a first alternative, the radio frequency field has two components each oscillating at its own oscillation frequency, for example a first component along the z axis at the angular frequency $\omega$ and a second component along the y axis at the angular frequency $\Omega$. In such a case, the polarisation device 3 is configured to give the pump beam a linear polarisation in a direction perpendicular to the direction of the two components of the radio frequency magnetic field (that is along the x axis). And to determine a measurement, associated with a measurement unit, of each of the three components of the ambient magnetic field, the processing unit 6 is configured to perform a synchronous detection of the photodetection signal provided by the measurement unit at a harmonic of each of the oscillation frequencies ($\omega$ and $\Omega$) and at an inter-harmonic of said oscillation frequencies ($\omega \pm \Omega$).

In a second alternative, it is also possible to use a three-axis optically pumped magnetometer architecture based on an elliptical polarisation of the pumping light and the application of three radio frequency fields as set forth in patent application EP 3 524 990 A1. In this alternative, the parametric resonance excitation circuit is thus configured such that it induces in the cell a radio frequency magnetic field having three components each oscillating at its own oscillation frequency. The polarisation device is configured in such a way as to give the pump beam an elliptical polarisation, the circularly polarised component of which is directed along the axis of propagation of the pump beam z and the linearly polarised component (half-major-axis of the ellipse) is directed along the x direction. And to determine a measurement, associated with a measurement unit, of each of the three components of the ambient magnetic field, the processing unit 6 is configured to perform a synchronous detection of the photodetection signal provided by the measurement unit at a harmonic of each of the oscillation frequencies.

The invention is not limited to a parametric resonance magnetometer but extends to any other optically pumped magnetometer architecture allowing a measurement of the three components of the magnetic field, such as the one set forth in the article by X. Qiu et al, Applied Physics Letters 116, 034001 (2020), entitled "Three-axis atomic magnetometer for nuclear magnetic resonance gyroscopes". This architecture, more complex than those described above, is based on the use of two atomic species, typically an optically pumped alkali and a noble gas present in the same cell. Two of the field components are measured via the n=1 parametric resonance of the alkali. The third component is obtained from the precession frequency of the noble gas.

The invention, which allows gradients to be measured on very short bases, finds application not only in the medical field (for example magnetoencephalography and magnetocardiography), but also in magneto-relaxometry methods for magnetic particles and for imaging ferromagnetic parts (for example of steel) for non-destructive testing (for example locating faults such as incipient cracking).

The invention is not limited to the magnetometer as described above but also extends to a method for measuring a spatial gradient of a magnetic field by means of such a magnetometer, this method comprising especially determining, for each measurement unit and from the photodetection signal supplied by the measurement unit of a measurement, associated with the measurement unit, of each of the three components of the ambient magnetic field, calculating at least one difference between the measurements, associated with different measurement units, of a component of the magnetic field and providing a gradiometric measurement signal comprising the at least one difference calculated.

The invention claimed is:

1. A three-axis vector optically pumped magnetometer, comprising:
   a cell filled with an atomic gas subjected to an ambient magnetic field, a projection of which on three rectangular coordinate axes defines three components thereof,
   a photodetector arranged so as to receive a probe beam that passed through the cell, wherein the photodetector comprises a plurality of measurement units arranged in a plane transverse to a direction of propagation of the probe beam, the measurement units each providing a photodetection signal, and
   a processing unit coupled to the photodetector and being configured to:
   determine, for each measurement unit and from the photodetection signal provided by the measurement unit, a measurement, associated with the measurement unit, of each of the three components of the ambient magnetic field; and
   calculate at least one difference between the measurements, associated with different measurement units, of a component of the magnetic field and deliver a gradiometric measurement signal comprising the at least one difference calculated.

2. The magnetometer according to claim 1, wherein the measurement units of the photodetector are arranged in array form and are at least 3*3 in number.

3. The magnetometer according to claim 1, wherein the photodetector is a photodiode array.

4. The magnetometer according to claim 1, wherein the photodetector is a charge coupled detector.

5. The magnetometer according to claim 4, wherein each measurement unit of the photodetector is formed by a plurality of pixels close to the charge coupled detector, the photodetection signal of each measurement unit corresponding to an average of the photodetection signals individually delivered by the pixels of the measurement unit.

6. The magnetometer according to claim 1, further comprising:
   a parametric resonance excitation circuit configured to induce in the cell a radio frequency magnetic field having two components each oscillating at its own oscillation frequency,
   an optical pumping source arranged to emit towards the cell a pump beam tuned to an atomic transition, the probe beam being identical to or distinct from the pump beam, and
   a polarisation device configured to impart a linear polarisation to the pump beam,
   wherein, to determine a measurement, associated with each measurement unit, of each of the three components of the ambient magnetic field, the processing unit is configured to perform synchronous detection of the photodetection signal provided by the measurement unit at a harmonic of each of the oscillation frequencies and at an inter-harmonic of the oscillation frequencies.

7. The magnetometer according to claim 1, further comprising:
   a parametric resonance excitation circuit configured to induce in the cell a radio frequency magnetic field having three components each oscillating at its own oscillation frequency, an optical pumping source arranged to emit towards the cell a pump beam tuned to an atomic transition, the probe beam being identical to or distinct from the pump beam, and a polarisation device configured to impart an elliptical polarisation to the pump beam, wherein, to determine a measurement, associated with each measurement unit, of each of the three components of the ambient magnetic field, the processing unit is configured to perform synchronous detection of the photodetection signal provided by the measurement unit at a harmonic of each of the oscillation frequencies.

8. The magnetometer according to claim 1, wherein the three components of the ambient magnetic field comprise two components, $B_x$ and $B_y$, transverse to the direction of propagation of the probe beam and one component, $B_z$, longitudinal to the direction of propagation of the probe beam, and the gradiometric measurement signal comprises:

transverse gradients of the $B_z$ component, $\partial B_z/\partial x$ and $\partial B_z/\partial y$, longitudinal gradients of the $B_x$ and $B_y$ components, $\partial B_x/\partial x$ and $\partial B_y/\partial y$, and a transverse gradient of the $B_x$ component and a transverse gradient of the $B_y$ component, $\partial B_x/\partial y$ and $\partial B_y/\partial x$.

9. A method for measuring a spatial gradient of a magnetic field by means of a three-axis vector optically pumped magnetometer which comprises:

a cell filled with an atomic gas subjected to an ambient magnetic field, a projection of which onto three rectangular coordinate axes defines three components thereof, a photodetector arranged so as to receive a probe beam that passed through the cell, the photodetector comprising a plurality of measurement units arranged in a plane transverse to a direction of propagation of the probe beam, the measurement units each providing a photodetection signal, and a processing unit coupled to the photodetector, said method comprising the following steps implemented by the processing unit, of:

determining, for each measurement unit and from the photodetection signal provided by the measurement unit, a measurement, associated with the measurement unit, of each of the three components of the ambient magnetic field; and calculating at least one difference between the measurements, associated with different measurement units, of a component of the magnetic field and providing a gradiometric measurement signal comprising the at least one difference calculated.

* * * * *